United States Patent
Kawai

(10) Patent No.: US 7,260,670 B2
(45) Date of Patent: Aug. 21, 2007

(54) NON-VOLATILE SEMICONDUCTOR MEMORY DEVICE AND ELECTRIC DEVICE WITH THE SAME

(75) Inventor: Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 372 days.

(21) Appl. No.: 10/865,936

(22) Filed: Jun. 14, 2004

(65) Prior Publication Data

US 2005/0172086 A1    Aug. 4, 2005

(30) Foreign Application Priority Data

Jan. 30, 2004    (JP) .............................. 2004-024219

(51) Int. Cl.
*G06F 12/00*    (2006.01)
(52) U.S. Cl. ...................... 711/100; 711/103; 711/154; 365/200; 365/202
(58) Field of Classification Search ................ 711/100, 711/103, 154; 365/200, 202
See application file for complete search history.

(56) References Cited

U.S. PATENT DOCUMENTS

| 6,661,706 B2 | 12/2003 | Kawai et al. | |
| 2003/0169630 A1* | 9/2003 | Hosono et al. | 365/200 |
| 2004/0202034 A1* | 10/2004 | Lee | 365/202 |

* cited by examiner

*Primary Examiner*—Kimberly McLean-Mayo
(74) *Attorney, Agent, or Firm*—Oblon, Spivak, McClelland, Maier & Neustadt, P.C.

(57) ABSTRACT

A non-volatile semiconductor memory device including: a plurality of cell arrays each having electrically rewritable and non-volatile memory cells arranged therein; a plurality of page buffers disposed in correspondence with the cell arrays respectively for reading and writing data by a page of the respective cell arrays; and a data bus shared by the cell arrays for data transferring between the page buffers and external terminals, wherein the non-volatile semiconductor memory device has a page copy mode defined as follows: read out data of a copy source page within a first cell array to a first page buffer; transfer the read out data to a second page buffer via the data bus; and then write the read out data into a copy destination page of a second cell array.

18 Claims, 15 Drawing Sheets

NON-VOLATILE SEMICONDUCTOR MEMORY DEVICE AND ELECTRIC DEVICE WITH THE SAME

CROSS-REFERENCE TO RELATED APPLICATION

This application is based on and claims the benefit of priority from the prior Japanese Patent Application No. 2004-24219, filed on Jan. 30, 2004, the entire contents of which are incorporated herein by reference.

BACKGROUND OF THE INVENTION

1. Field of the Invention

This invention relates to a non-volatile semiconductor memory device (EEPROM).

2. Description of Related Art

A NAND-type flash memory is well known as one of electrically!erasable and programmable ROMs (EE-PROMs). The NAND-type flash memory has a page buffer, which is able to read and write 1-page data, and data read and write are performed by a page. In case it is required to over-write data into a block, a write sequence is controlled as to write data by a page after having erased the block. Therefore, if it is required to rewrite part of block data, it is necessary to do a page copy operation in such a manner as to read out data of the block, and then write it into another block (i.e., spare block) which has already been erased.

To transfer data between blocks, it is necessary for performing multiple data read and write operations. This leads to data disturbance. Therefore, to assure of data reliability in a page copy mode, it is desirable to do error checking and correcting for the read out data of the respective copy source pages. In case an ECC circuit is disposed outside the memory chip, the read out data, which is read out of the cell array and stored in the page buffer, is output outside of the chip and input to the ECC circuit. Usually, data outputting from the page buffer to I/O terminals is performed in such a manner that one page data is serially transferred by a byte. Write data, an error bit of which is corrected in the ECC circuit, is written into a copy destination page. In this case, the write data loading may be done as to rewrite part of the read data held in the page buffer, which includes an error bit (for example, refer to Japanese Patent application Laid Open No. 2003-030993).

The above-described page copy operation will be performed without making so much the sacrifice of performance due to ECC, in case it is performed within a cell array which is to be connected to a page buffer. However, there is a problem in case page copy is performed between cell array planes in a flash memory having a plurality of cell array planes. For example, assume here that one page in one plane is formed of 2 kByte normal data area and 64 Byte redundant area, and assume that it takes 50 nsec for loading 1-Byte data. In case of copy operation within a plane, it takes only 50 nsec to load 1-Byte data including an error-corrected bit. By contrast, to do a copy operation between planes, it is required to load one page data. In detail, one page data read out of a plane, which is partially corrected in case an error bit has been detected, while without correcting in case no errors have been detected, should be loaded in another page buffer connected to another plane. Therefore, it takes a time of 50 [nsec]×2112[Byte] (i.e., longer than 100 [μsec]) for loading data.

If a specification is defined as to restrict a page copy operation between different planes in a flash memory with plural planes for preventing the above-described sacrifice of performance, the memory will become incompatible with other flash memories with only one plane. Such the flash memory becomes hard to deal with for users.

SUMMARY OF THE INVENTION

According to an aspect of the present invention, there is provided a non-volatile semiconductor memory device including:

a plurality of cell arrays each having electrically rewritable and non-volatile memory cells arranged therein;

a plurality of page buffers disposed in correspondence with the cell arrays respectively for reading and writing data by a page of the respective cell arrays; and a data bus shared by the cell arrays for data transferring between the page buffers and external terminals, wherein the non-volatile semiconductor memory device has a page copy mode defined as follows: read out data of a copy source page within a first cell array to a first page buffer; transfer the read out data to a second page buffer via the data bus; and then write the read out data into a copy destination page of a second cell array.

DETAILED DESCRIPTION OF THE EMBODIMENTS

Illustrative embodiments of this invention will be explained with reference to the accompanying drawings below.

Embodiment 1

Figure 1:
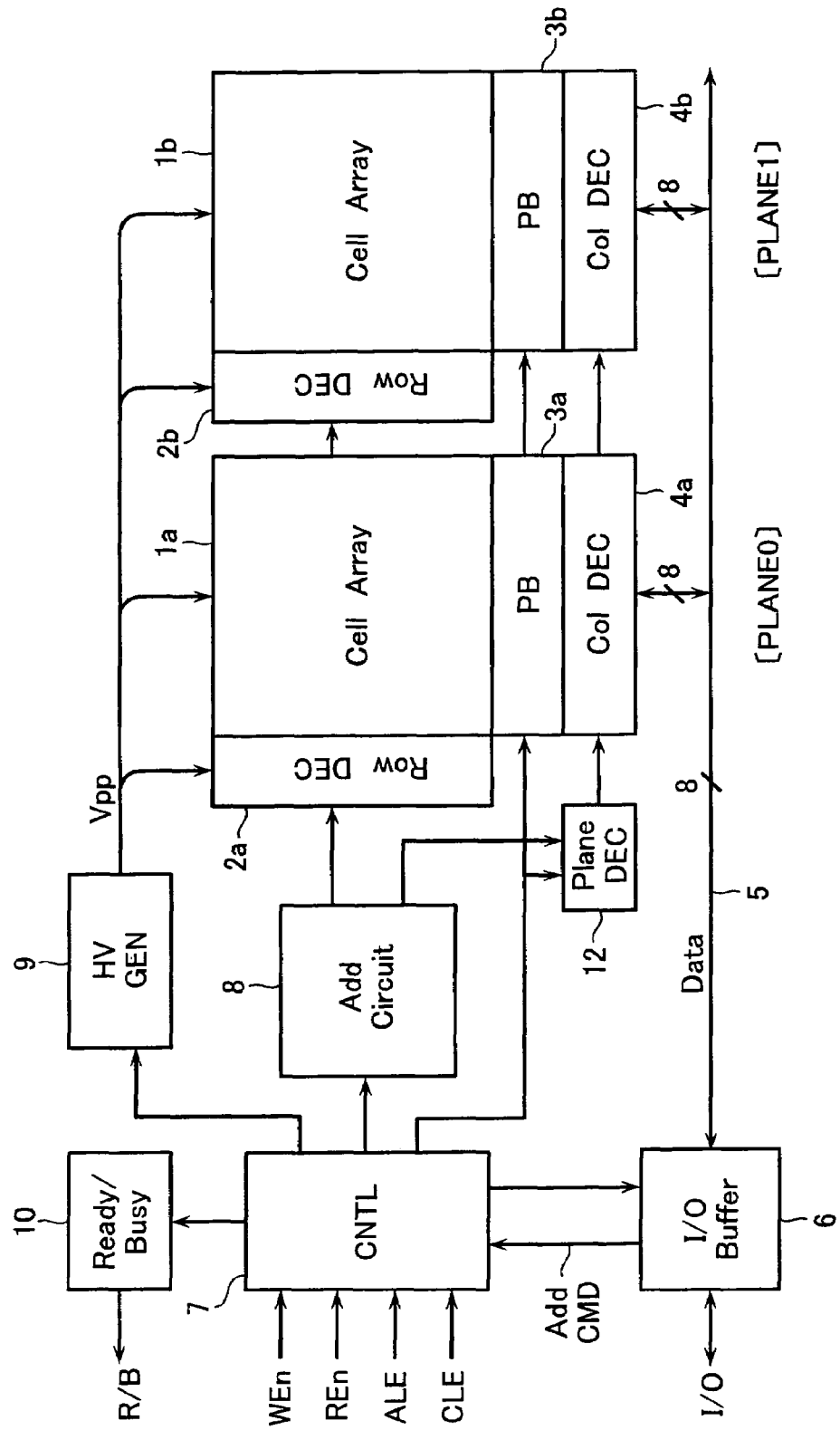
FIG. 1 shows a block configuration of a flash memory in accordance with an embodiment of the present invention.

FIG. 1 sows a block configuration of a NAND-type flash memory in accordance with an embodiment. In this embodiment, there is shown a flash memory with two planes PLANE0 and PLANE1. These planes PLANE0 and PLANE1 have cell arrays 1a and 1b, respectively, word lines and bit lines of which are disposed independent of each other. Row decoders (including word line drivers) 2a and 2b are disposed in correspondence with the cell arrays 1a and 1b, respectively, for selectively driving word lines. In detail, each of the row decoders 2a and 2b is configured to select a page. Further disposed in correspondence with the cell arrays 1a and 1b are sense amplifier circuits constituting page buffers 3a and 3b, respectively, which are used for sensing one page data and storing one page write data.

A data bus 5 is formed of eight signal lines for parallel-transferring 1-Byte data to be shared by two planes PLANE0 and PLANE1. Data transferring between the page buffers 3a, 3b and external I/O terminals is done via the data bus 5 and I/O buffer 6. Between the page buffers 3a, 3b and the data bus 5, there are prepared column decoders 4a, 4b including column gate circuits for serially transferring one page data by a byte.

A plane select decoder 12 is configured to select one of the planes PLANE0 and PLANE1 in a normal data read mode, i.e., selectively activate one of the column decoders 4a and 4b in response to, for example, that the uppermost bit of address is "0" or "1". In a page copy mode, to do data transferring between the page buffers 3a and 3b simultaneously with data outputting as described later, the plane select decoder 12 becomes to be an all-selecting state that simultaneously activates the column decoders 4a and 4b. The above-mentioned states of the plane decoder 12 may be controlled by a controller 7 in response to an external control signal.

In detail, each of the cell arrays 1a and 1b is formed of a plurality of blocks BLK0, BLK1, . . . , BLKn-1 each of which includes a plurality of pages. Each page is formed of a normal data area of 2 k-Byte and a redundant area of 64-Byte. The redundant area includes spare column area for defective column replacing, ECC data storing area and the like.

The controller 7 is prepared for sequentially controlling data write and erase, and controlling data read. The controller 7 executes necessary operation controls in response to external control signals such as write enable signal WEn, read enable signal REn, address latch enable signal ALE, command latch enable signal, and the like. In detail, the controller 7 receives address "Add" and command "CMD" supplied from the I/O terminals. Address "Add" is transferred to the row decoders 2a, 2b, plane decoder 12 and column decoders 4a, 4b via an address circuit 8 which holds and transfers the address. In a write mode, one page write data are loaded in the page buffers 3a or 3b, and then written into a selected page in accordance with a sequential control executed by the controller 7.

A high voltage generation circuit 9 is controlled by the controller 7 so as to generate various high voltages necessary in write, read and erase modes. A status register 10 is set to output a status signal (R/B) outside of the chip, which teaches whether the chip is in a ready or busy state.

Figure 3:
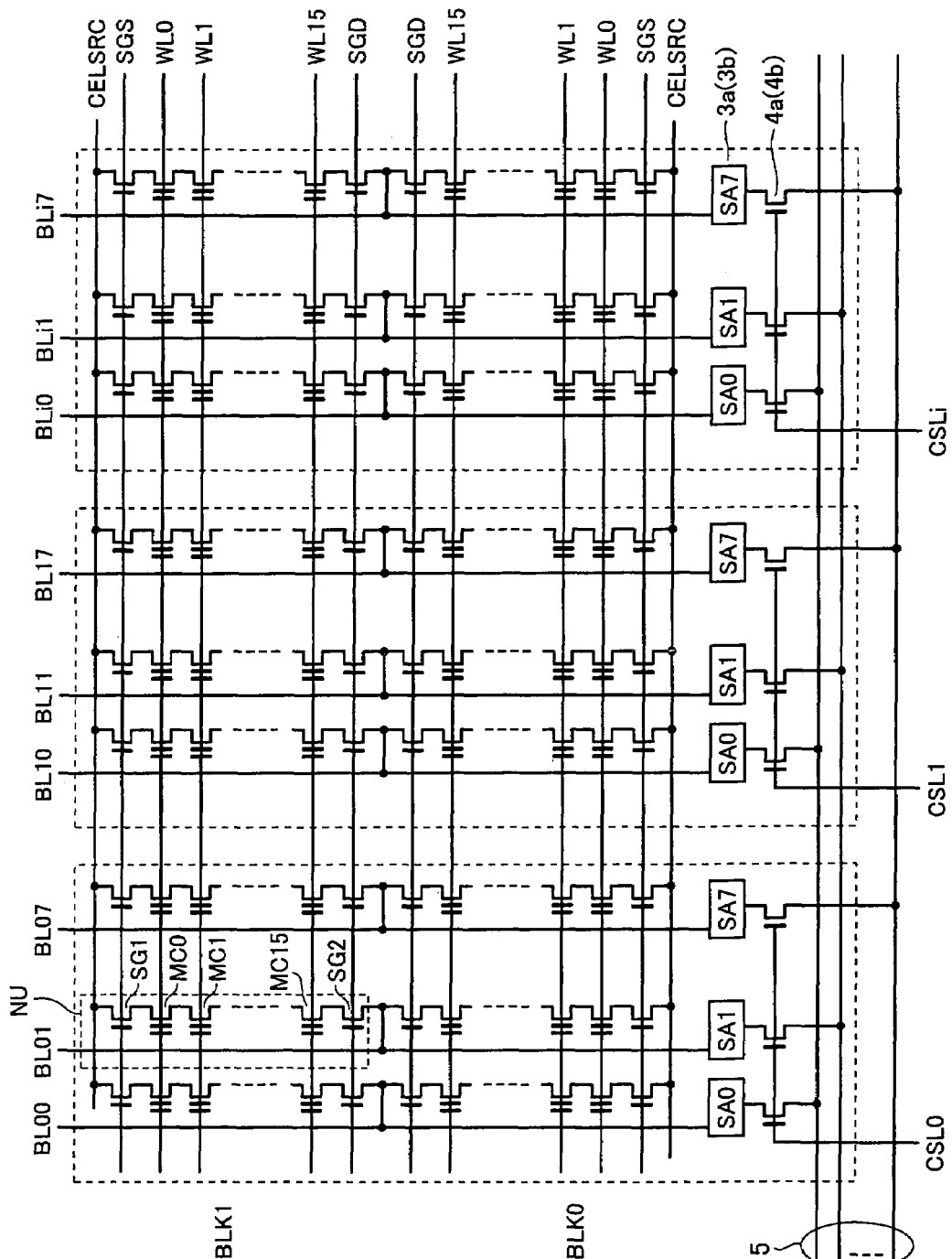
FIG. 3 shows a detailed arrangement of the cell array.

FIG. 3 shows a detail arrangement of the cell array 1. Plural memory cells (in this case, 16 memory cells) MC0-MC15 are connected in series to constitute a NAND cell unit NU. Plural NAND cell units NU are arranged in a matrix manner. Each memory cell MCi is formed of a stacked gate MOS transistor with a floating gate serving as a charge storage layer, and stores a threshold state as a data bit in a non-volatile manner, which is defined by a charge storage state of the floating gate. The cell data is electrically rewritable by charge injecting into the floating gate and charge releasing from it.

One end of the NAND cell unit NU is coupled to a common source line CELSRC via a select gate transistor SG1, and the other end to a bit line BL via another select gate transistor SG2. Control gates of the respective memory cells MCi in the NAND cell unit NU are connected to different word lines WLi. Gates of the select gate transistors SG1 and SG2 are connected to select gate lines SGS and SGD, respectively, which are disposed in parallel with the word lines WLi.

Figure 2:
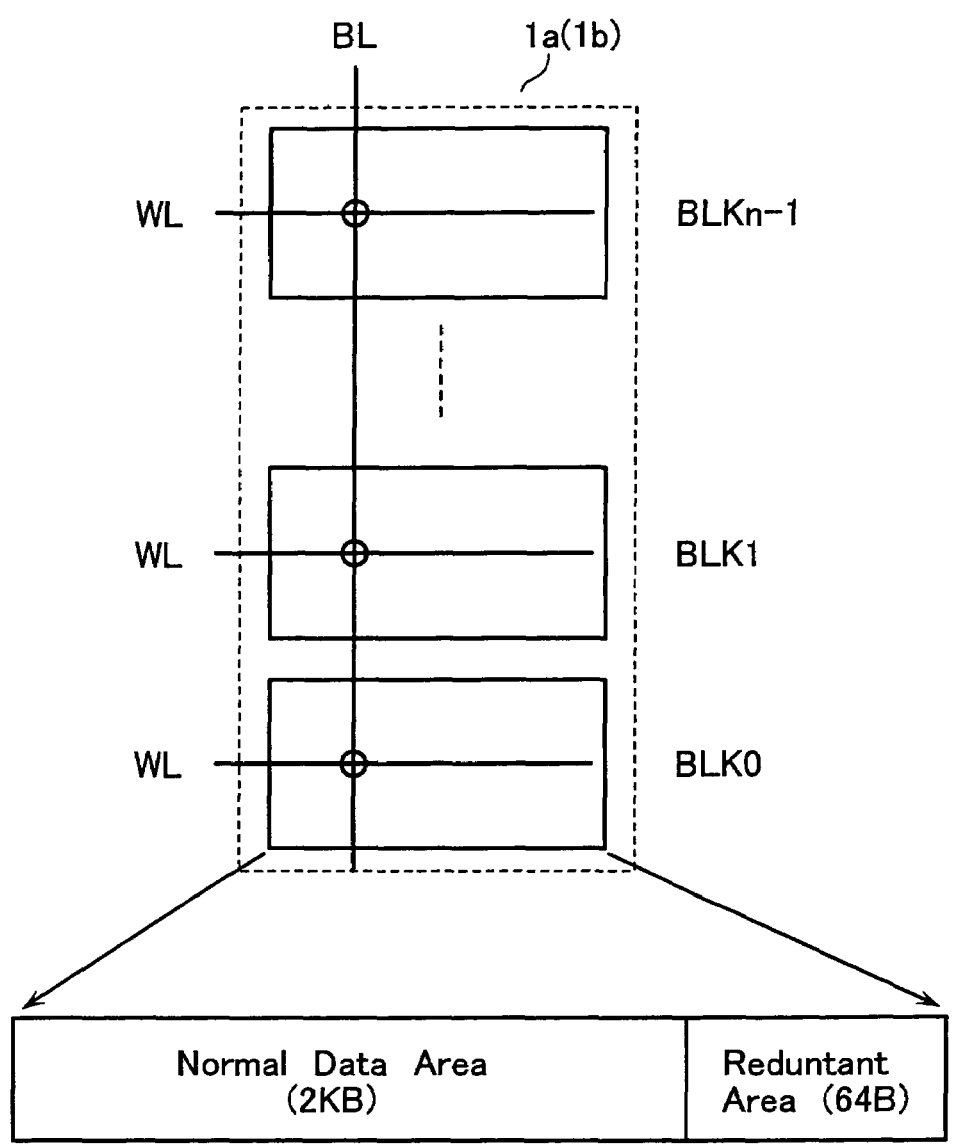
FIG. 2 shows a cell array of the flash memory.

A group of memory cells arranged along a word line constitute one page or two pages, and one page serves as a unit of data read and write. A block, which is defined as a group of NAND cell units sharing a word line, serves as a unit of data erasure. As shown in FIGS. 2 and 3, a plurality of blocks BLKj (j=0, 1, . . . ) are arranged in the direction of the bit line BL.

Figure 4:
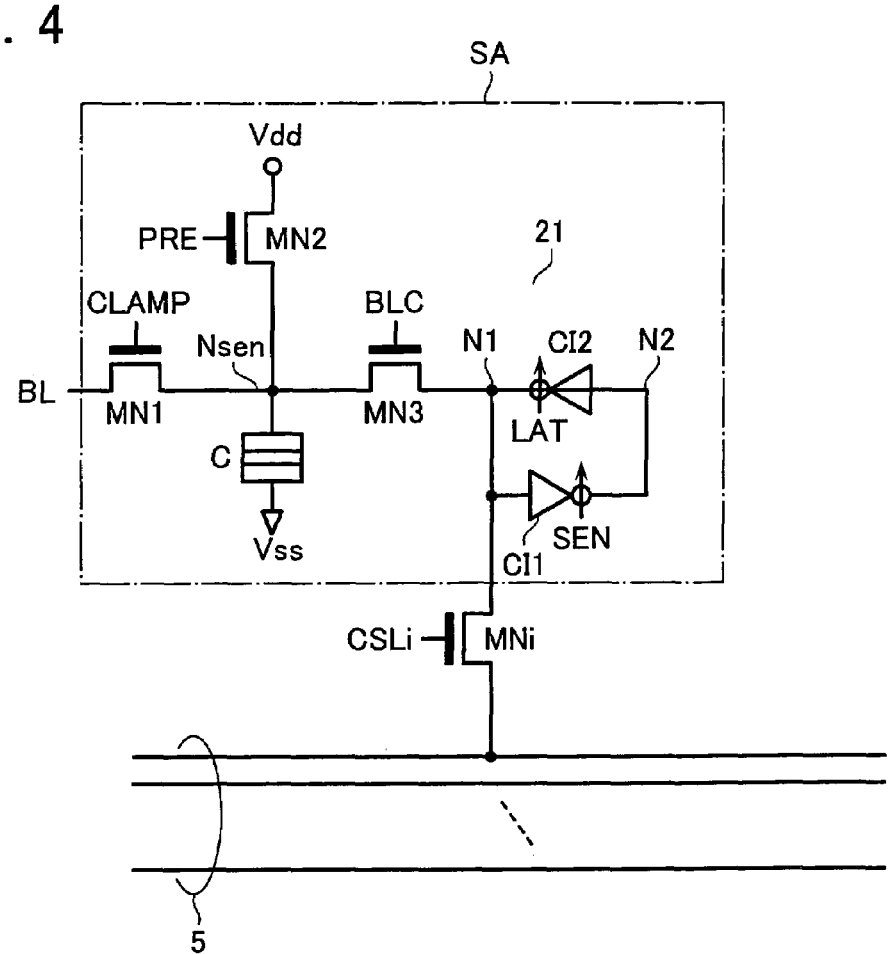
FIG. 4 shows a sense unit in a page buffer of the flash memory.

FIG. 4 shows a main portion of a sense unit SA, which constitutes the page buffers 3a and 3b. The sense unit SA has a sense node Nsen selectively coupled to the bit line BL via a clamping NMOS transistor MN1. This clamping transistor MN1 serves for clamping the bit line voltage and serves as a pre-sense amplifier.

A precharging NMOS transistor MN2 and a charge storing capacitor C are coupled to the sense node Nsen. The precharge transistor MN2 serves for precharging the bit line BL together with the clamping transistor MN1, and precharging the sense node Nsen. The sense node Nsen is connected to one data node N1 of a data latch 21 via a transferring NMOS transistor MN3. The data latch 21 is formed of clocked inverters CI1 and CI2 which are parallel-connected with reverse polarities between data nodes N1 and N2. The data node N1 is coupled to one signal line of the data bus 5 via NMOS transistor MNi which is a column select gate.

Although there is omitted in this drawing, it should be noted that the sense unit SA has a data storage circuit, which is used to store and write back write data in a write cycle, and a verify-check circuit, which is used in a verify-read operation (i.e., write-verify read operation) for verifying a write state.

Figure 5:
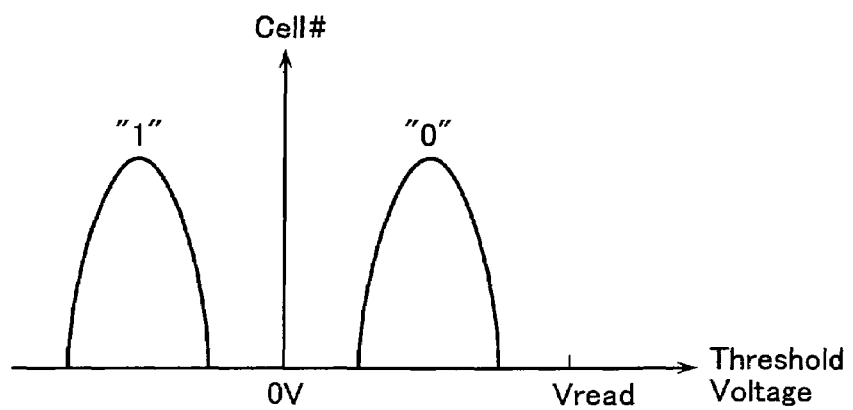
FIG. 5 shows a threshold distribution of data of the flash memory.

FIG. 5 shows a data threshold distribution in case this NAND-type flash memory is used for storing binary data. A negative threshold state is defined as data "1" (erase state), and a positive threshold state as data "0" (write state in a narrow sense). Data "0" write is done by electron injection from channel to floating gate due to FN tunneling in a selected memory cell.

In detail, one page data write is performed as follows: transfer Vss and Vdd-Vth (Vth; threshold voltage of the select gate transistor SG1) to selected cell's channels in NAND cell units from the respective bit lines in correspondence with write data "0" and "1", respectively; and then apply a write voltage Vpgm (e.g., 20V) to a selected word line. Under this condition, a large electric field is applied between the floating gate and channel in a memory cell to which "0" data is supplied, whereby electrons are injected into the floating gate ("0" write), while a channel is boosted in potential due to capacitive coupling in another memory cell to which "1" data is supplied, whereby electron injection will not occur (write inhibition).

Data write is, in practice, performed by repeating write pulse voltage application and verify-read for verifying the write state until the entire one page write data are completely written.

Data erase is done as follows: apply 0V to all word lines in a selected block; set the select gate lines SGD, SGS, all bit lines BL and the common source line CELSRC to be in a floating state; and apply an erase voltage Vera (e.g., 20V) to a p-type well on which the cell array is formed. As a result, the entire memory cells in the selected block experience electron releasing from floating gates to channels, thereby resulting in an erase state with a negative threshold voltage (data "1").

Figure 6:
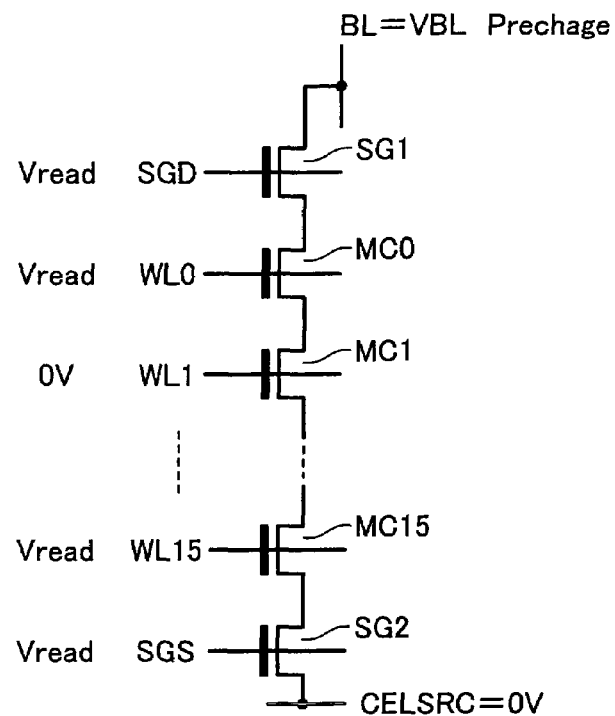
FIG. 6 shows a bias condition in a read mode of the flash memory.

Next, giving attention to the sense unit SA shown in FIG. 4, a read operation of the flash memory in accordance with this embodiment will be explained. FIG. 6 shows a bias condition at a read time referring to one NAND cell unit. In the read mode, the bit line is precharged at VBL lower than the power supply voltage Vcc. Thereafter, apply 0V to a selected word line (WL1 in case of FIG. 6); apply a pass voltage Vread as shown in FIG. 5 to the remaining word lines, which turns on cells without regard to cell data; and apply the pass voltage Vread to the select gate lines SGD and SGS. Under this bias condition, in case data of a memory cell disposed along the selected word line is "1", the corresponding bit line BL will be discharged, while the bit line BL will not be discharged in case of data "0". Detecting the bit line discharge states, which are different from each other in correspondence with cell data, it is possible to determine cell data.

Figure 7:
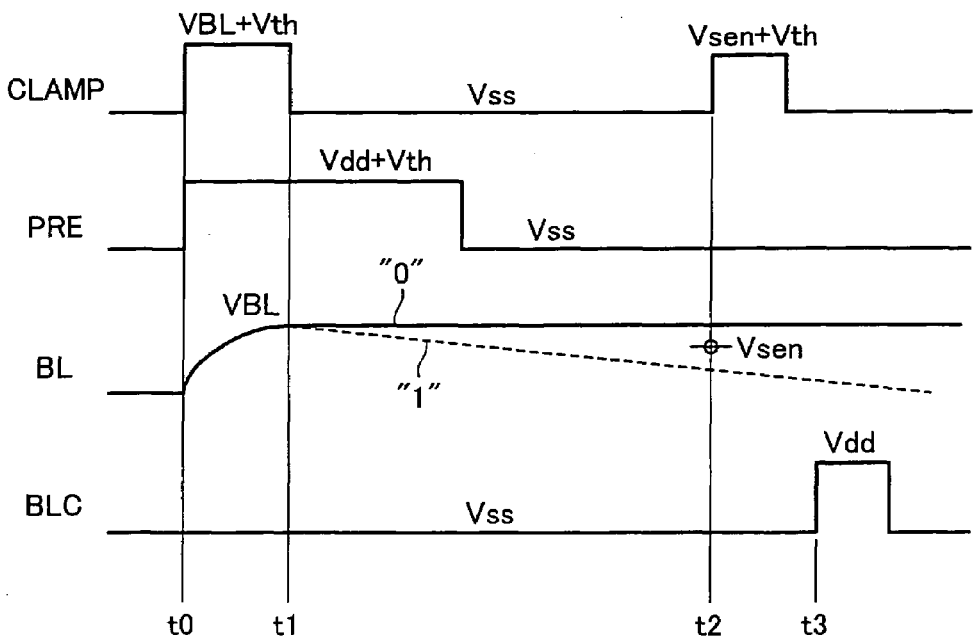
FIG. 7 shows read waveforms of the flash memory by giving attention to the sense unit.

FIG. 7 is a timing chart of the read operation referring to the sense unit SA. Apply VBL+Vth (Vth; threshold voltage of NMOS transistor) to the gate CLAMP of the clamping transistor MN1, and simultaneously apply Vdd+Vth to the gate PRE of the precharge transistor MN2, and the bit line BL and sense node Nsen are precharged (timing t0). The bit line BL will be precharged at VBL via transistors MN1 and MN2, and the sense node Nsen at Vdd.

The bit line precharge operation is stopped at timing t1, and then bit line discharge starts based on cell data. That is, to the select gate line SGD disposed as the bit line side, Vread is applied at timing t1 under the bias condition shown in FIG. 6. As a result, the bit line BL precharged at VBL is held at about VBL in case the cell data is "0" (as shown by a solid line), while the bit line is gradually discharged to be reduced in voltage in case the cell data is "1" (as shown by a dotted line).

After waiting a certain time period after bit line discharge starting, the precharge transistor MN2 being turned off within the time period, apply a sense-use voltage Vsen+Vth (Vsen<VBL) to the gate CLAMP of the clamping transistor MN1 (timing t2). In case the cell data is "0", the clamping transistor MN1 is off, whereby the sense node Nsen will be held at the precharged voltage Vdd, while in case the cell data is "1", the clamping transistor MN1 turns on, whereby the sense node Nsen will be reduced in voltage to about bit line voltage level. That is, the bit line voltage is amplified due to charge sharing between the sense node Nsen and the bit line BL. Then, apply an "H" level signal to the gate BLC of transferring transistor MN3 at timing t3, and the sensed data at the sense node Nsen is transferred to and latched in the data latch 21.

In a normal data read mode, either of the planes PLANE0 and PLANE1 is selectively subjected to data reading, and one page read out data thereof are stored in the page buffer 3a or 3b. Inputting an external read enable signal, the read our data stored in the page buffer 3a or 3b are serially transferred and output by one byte via the data bus 5.

In this embodiment, there is prepared a page copy mode in which a high-speed page copy operation is performed between planes. In detail, in this page copy mode, read out data in one page buffer are serially output outside of the chip, and simultaneously transferred to and stored in the other page buffer as write data.

The data transfer operation in the page copy mode will be explained with reference to FIGS. 8A to 8D. FIGS. 8A to 8D show data output operations for outputting a copy source page data read out in one page-buffer 3a disposed on one plane PLANE0 side and data transfer operations executed at the same time for transferring the same data to the other page buffer 3b disposed on the other plane PLANE1 side. Each exemplary data in the page buffers 3a and 3b is expressed as 1-Byte data.

Figure 8A:
FIGS. 8A to 8D are diagrams for explanation of output operations of read data and data transferring operations between page buffers.

FIG. 8A shows a state just after data of a copy source page of the plane PLANE0 having read in the page buffer 3a. In this state, input an external read enable signal REn, and the read out data in the page buffer 3a will be sequentially column-selected and output outside of the chip via the data bus 5 by a byte. The output data will be input into the ECC circuit to be subjected to error-checking and correcting.

Figure 8B:
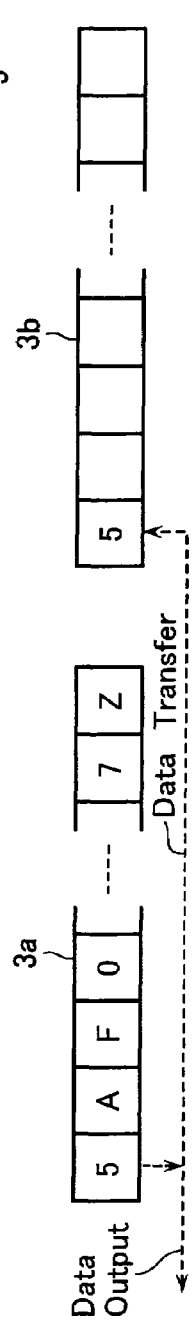
Figure 8C:
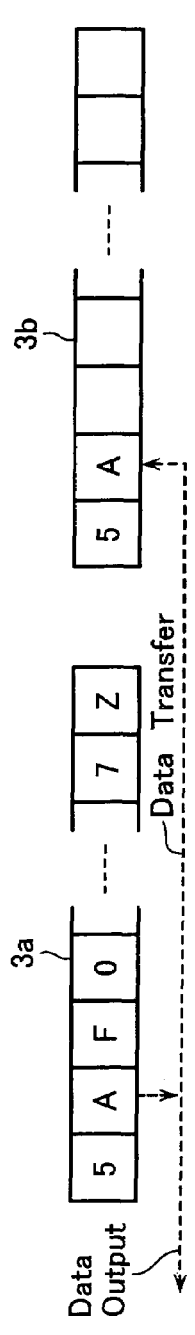
Figure 8D:
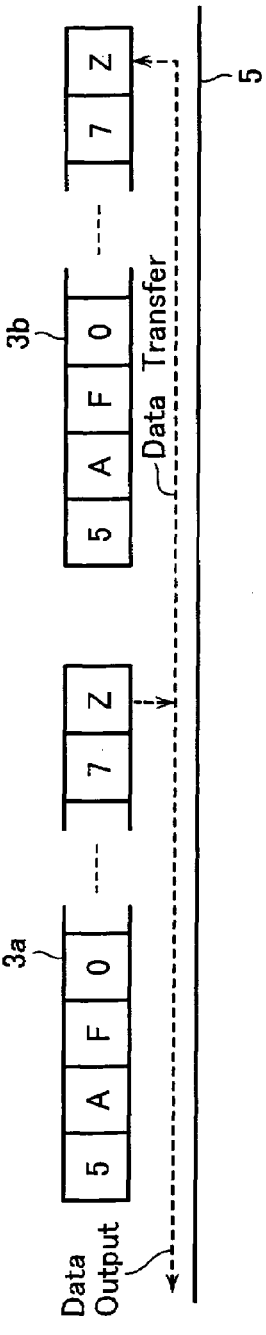

FIG. 8B shows a state in which data "5" of the head column is output outside of the chip, and simultaneously transferred to the page buffer 3b. FIG. 8C shows a state in which next column data "A" is output outside of the chip, and simultaneously transferred to the page buffer 3b. Hereinafter, similar operations will be repeatedly performed as synchronized with the toggle of the read enable signal REn until the final state as shown in FIG. 8D in which the last column data is output and transferred to the page buffer 3b.

Figure 9:
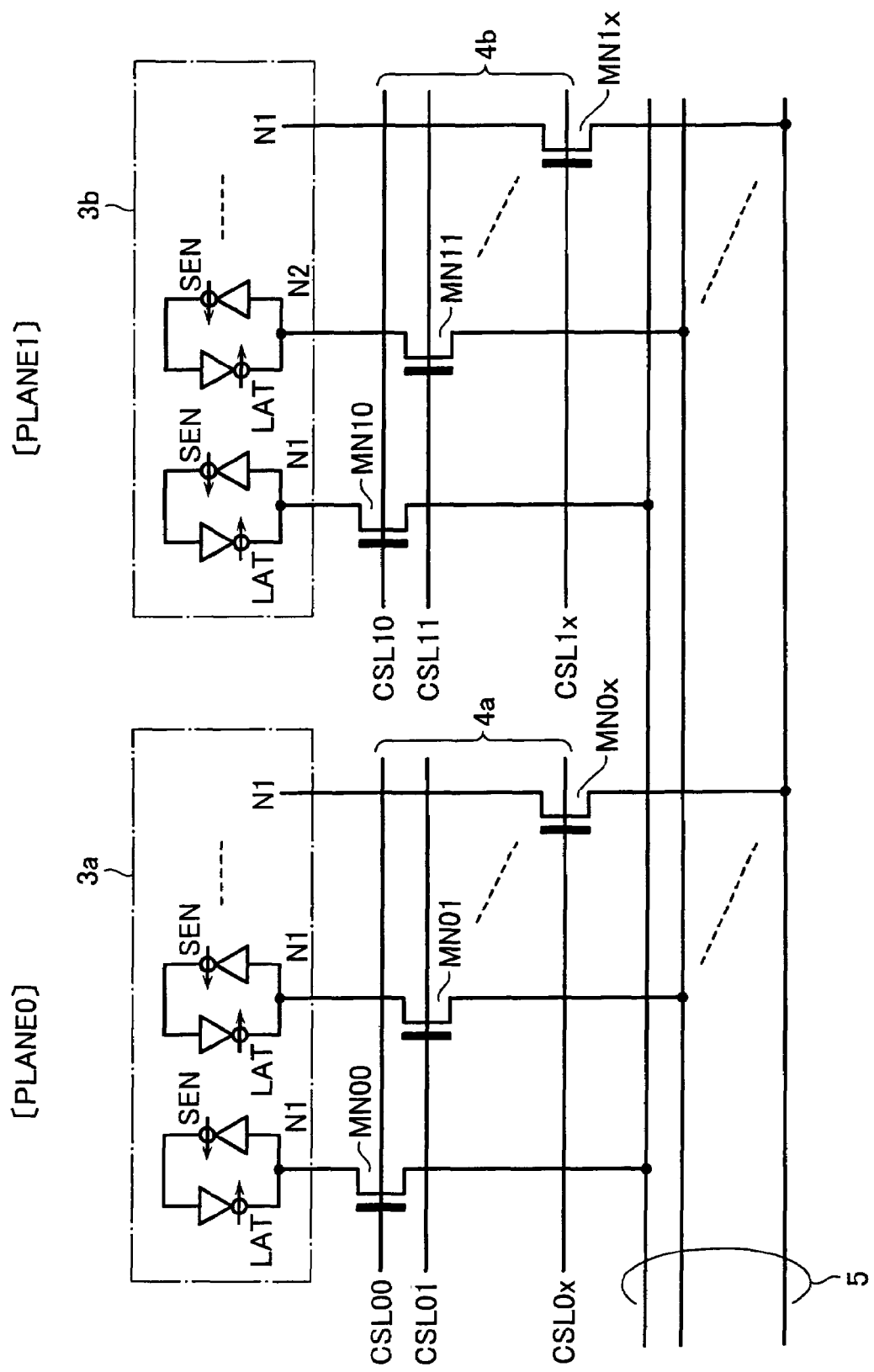
FIG. 9 shows circuit portions concerned in data transferring between the page buffers of the flash memory.
Figure 10:
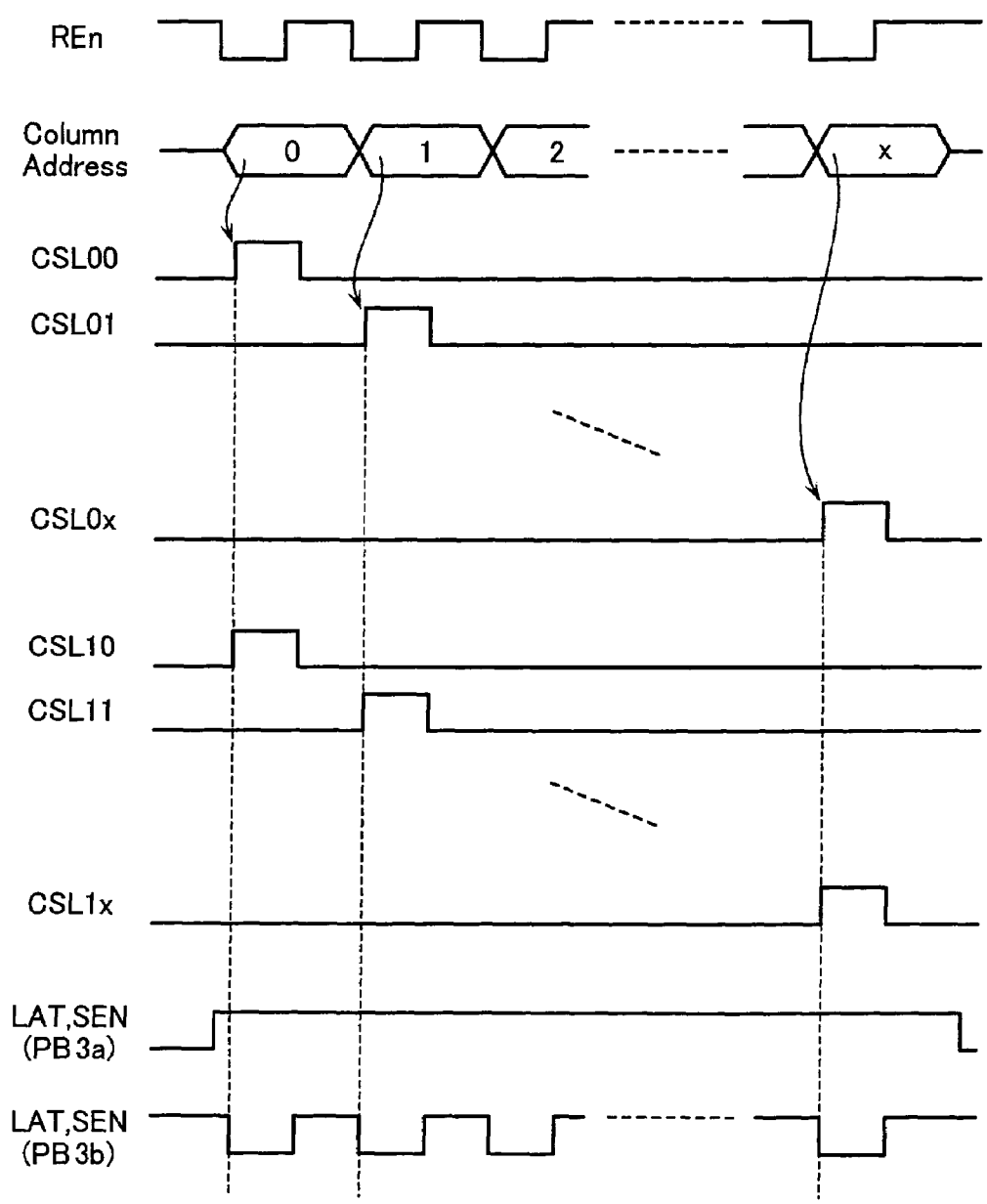
FIG. 10 shows a timing chart of data transferring between the page buffers of the flash memory.

The above-described serial data outputting and data transferring between planes will be explained with more details with reference to FIGS. 9 and 10. Data nodes N1 of the page buffers 3a and 3b are connected to data bus 5 via select transistors MN00-MN0x and MN10-MN1x which constitute column select gate circuits. The select transistors MN00-MN0x are driven by column select signals CSL00-CSL0x, respectively, which are outputs of the column decoder 4a. The select transistors MN10-MN1x are driven by column select signals CSL10-CSL1x, respectively, which are decoded output signals of the column decoder 4b.

Either of the column decoders 4a and 4b is selected to be activated in the normal data read mode. In contrast to this, the plane select decoder 12 becomes in an all-select state so as to simultaneously activate the column decoders 4a and 4b in the page copy mode. Therefore, externally input the read enable signal REn as shown in FIG. 10, and increment column address as synchronous with it, and the corresponding two column select signals (CSL00, CSL10), (CSL01, CSL11), . . . , and (CSL0x, CSL1x) are sequentially activated to simultaneously select the planes PLANE0 and PLANE1.

During the output operation of the copy source page data, the data latches 21 are kept active in response to the activating signals, LAT=SEN="H", in the page buffer 3a, while in the page buffer 3b, the respective data latches 21 will be set to be inactive and active as synchronous with the column select signals. As a result, the page data in the page buffer 3a are serially output outside of the chip by a byte, and simultaneously transferred to and loaded in the page buffer 3b.

Data output outside of the chip is input into the ECC circuit disposed in the host system to be subjected to at least one bit error-check and correct. Thereafter, input copy destination page address for the cell array 1b, and input write data as synchronous with a write enable signal WEn. Note here that the write data is input only in case there is an error-corrected bit in the ECC circuit. In detail, 1-Byte data including a corrected bit are over-written into the page buffer 3b, whereby one page data stored in the page buffer 3b are rewritten in part. Thereafter, the write data in the page buffer 3b are written into the copy destination page in the cell array 1b in accordance with the normal write sequence controlled by the controller 7.

As described above, according to this embodiment, it becomes easy to do page copy between the planes, thereby improving in page copy performance. Details thereof will be explained as follows. Suppose that one page is formed of 2 k-Byte normal data area plus 64-Byte redundant area for each plane, and suppose that it takes 50 nsec for loading 1-Byte data. In case of page copy from PLANE0 to PLANE1 in accordance with the conventional method, it takes 50[nsec]×2112[Byte]>100[/µsec] for loading one page data output outside of the chip. By contrast, it takes only 50 nsec necessary for loading 1-Byte data including an error-corrected bit in this embodiment. Therefore, it becomes possible to do high-speed page copy even if it is done between planes. This results in that it has no need of designing a specification in which the copy operation between planes is restricted, and keeps compatible with the flash memory with one plane.

Embodiment 2

Figure 11:
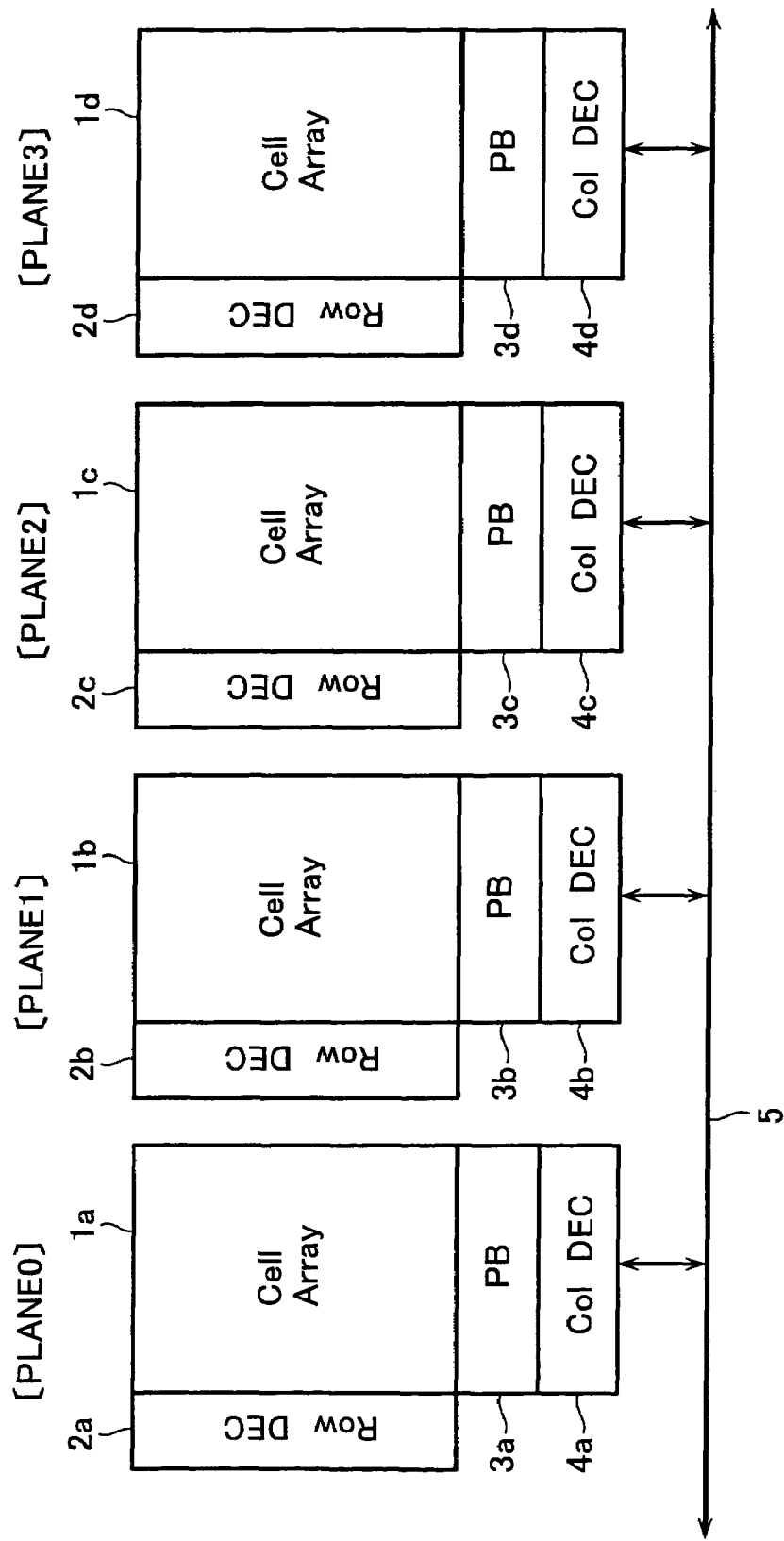
FIG. 11 shows a plane arrangement of a flash memory in accordance with another embodiment.

Although the device has two planes in the above-described embodiment, this invention may be applied to other NAND-type flash memories with more planes than the above-described embodiment. For example, FIG. 11 shows a NAND-type flash memory with four planes PLANE0 to PLANE3 disposed therein. Row decoders 2a to 2d, page buffers 3a to 3d and column decoders 4a to 4d are disposed for the respective planes. The data bus 5 is shared by these planes. The others are the same as the above-described embodiment.

In this embodiment, a page copy mode may be controlled in such a manner that while page data of a plane stored in a page buffer are serially output, the same data are transferred to the entire page buffers in correspondence with the remaining planes at the same time. In detail, the plane select decoder 12 shown in FIG. 1 is changed to have a basic configuration that plane selection is done by the uppermost two bits of address, and settable to be in an all-select state in the page copy mode. As a result, as similar to the above-described embodiment, input a copy destination page address and write data after having output the read out data, and it is possible to perform page copy write into a selected page in a selected plane. Write data input, which is necessary only when the ECC circuit has error-corrected, may be done by over-writing only 1-Byte data into a data region where includes an error bit in the page buffer. This is the same as the above-described embodiment.

Embodiment 3

In the above-described embodiments, while read out data in a page buffer are serially output, the same data are transferred to another or other page buffers at the same time. By contrast, it is also possible to use a scheme in which 1-page data of a page buffer are transferred to another buffer in a lump.

Figure 12:
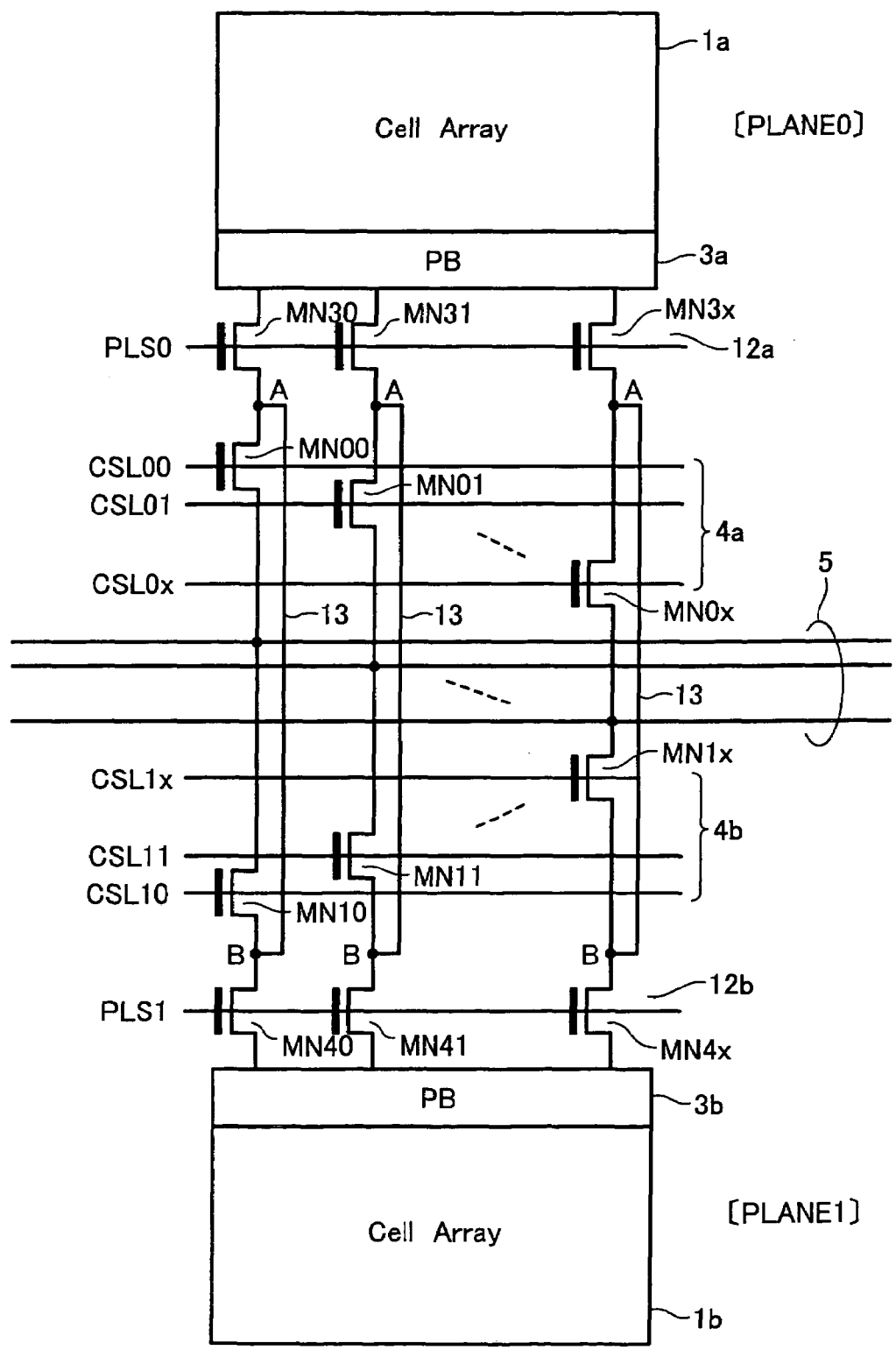
FIG. 12 shows circuit portions concerned in data transferring between the page buffers of the flash memory.

FIG. 12 shows a NAND-type flash memory in accordance with this embodiment. In FIG. 12, only two planes PLANE0 and PLANE1 (i.e., cell arrays 1a and 1b) and data transferring portion including column select gate circuits 4a and 4b are shown in the flash memory. The others are the same as Embodiment 1. The column select gate circuits 4a and 4b are, as similar to Embodiment 1, are sequentially selected by column select signals CSL00-CSL0x and CSL10-CSL1x so as to couple the data nodes of the page buffers 3a and 3b to the corresponding data lines in the data bus 5.

Further disposed between these column select gate circuits 4a, 4b and the page buffers 3a, 3b, respectively, are plane select gate circuits 12a, 12b, which are driven by plane select signals PLS0, PLS1 output from the plane decoder 12. The plane select gate circuits 12a and 12b have 1-page gate transistors MN30-MN3x and MN40-MN4x, which are driven in a lump by plane select signals PLS0 and PLS1, respectively. Bypass signal lines 13 are disposed between one side connection nodes A between the gate transistors MN30-MN3x and column select gates MN00-MN1x, and the other side connection nodes B between the gate transistors MN40-MN4x and the column select gates MN10-MN1k, respectively.

Figure 13:
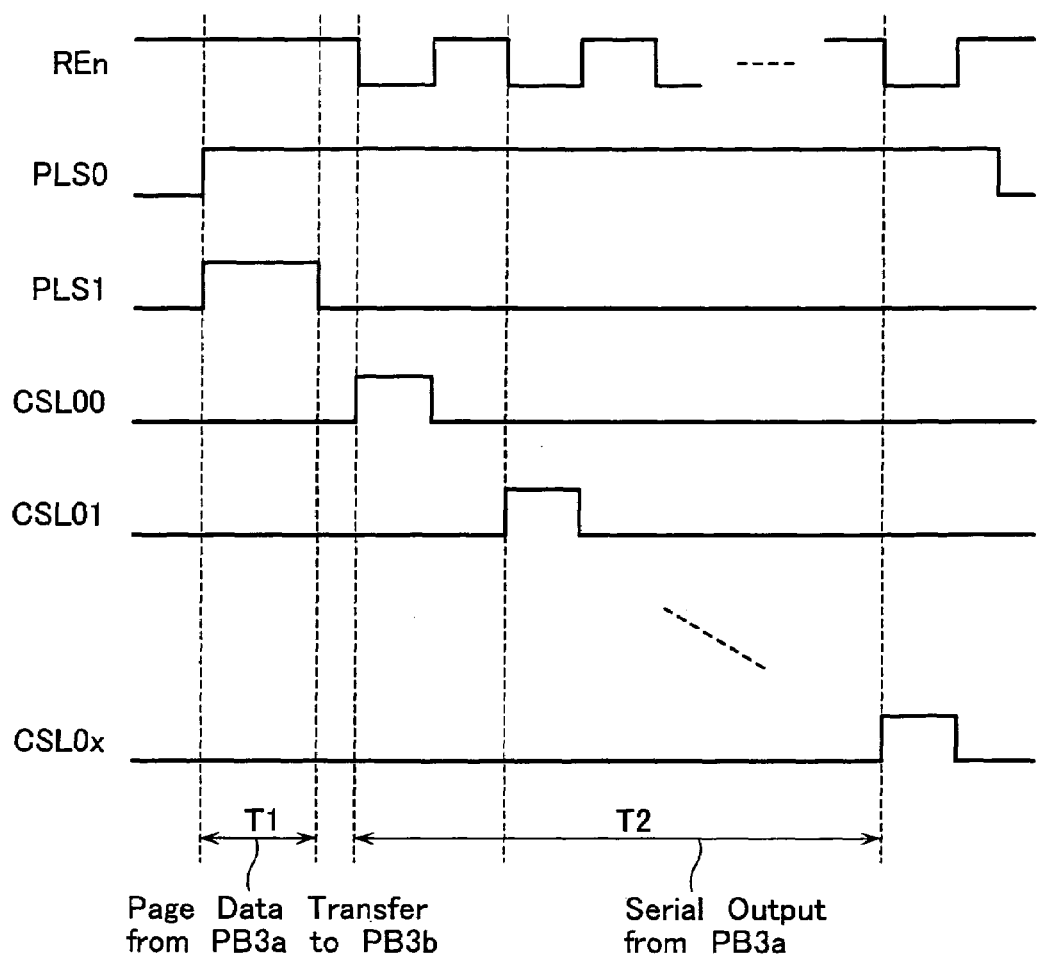
FIG. 13 is a timing chart for explanation of output operations of read data and data transferring operations between page buffers of the flash memory.

FIG. 13 shows a data transferring timing chart in a page copy mode in this embodiment. As similar to Embodiment 1, data of a copy source page in one plane PLANE0 are read out to the page buffer 3a. Thereafter, as shown in FIG. 13, both the plane select signals PLS0 and PLS1 become "H" (i.e., all-select state) during a certain period T1. In response to this, the plane select gate circuits 12a and 12b become on simultaneously, whereby 1-page read out data in the page buffer 3a are transferred to the page buffer 3b in a lump via the signal lines 13. The page buffer 3b is kept inactive at the data transferring time as similar to Embodiment 1, and then activated after having transferred the data to latch transferred data.

After making the plane select signal PLS1 inactive ("L") to turn off the gate circuit 12b, externally input the read enable signal REn during a period T2, and column address is incremented as synchronized with the read enable signal to sequentially cause the column select signals CSL00-CSL0x to be "H", whereby data stored in the page buffer 3a are serially transferred on the data bus 5 to be output outside of the chip by a byte.

Thereafter, data write into a copy destination page of the plane PLANE1 may be performed as similar to that in Embodiment 1. In detail, data output outside of the chip are input into the ECC circuit, which is disposed in the host system, to be subjected to error checking and correcting. Thereafter, input copy destination page address of the plane PLANE1 (i.e., cell array 1b), and input write data as synchronized with a write enable signal WEn. Note here that the write data are input only in case there is an error-corrected bit in the ECC circuit. 1-Byte data including a corrected bit are over-written into the page buffer 3b, whereby one page data stored in the page buffer 3b are partially rewritten. Thereafter, the write data in the page buffer 3b are written into the copy destination page in the cell array 1b in accordance with the normal write sequence controlled by the controller 7.

According to this Embodiment 3, it becomes possible to do a page copy operation between planes with a high performance as well as Embodiment 1.

Embodiment 4

Figure 14:
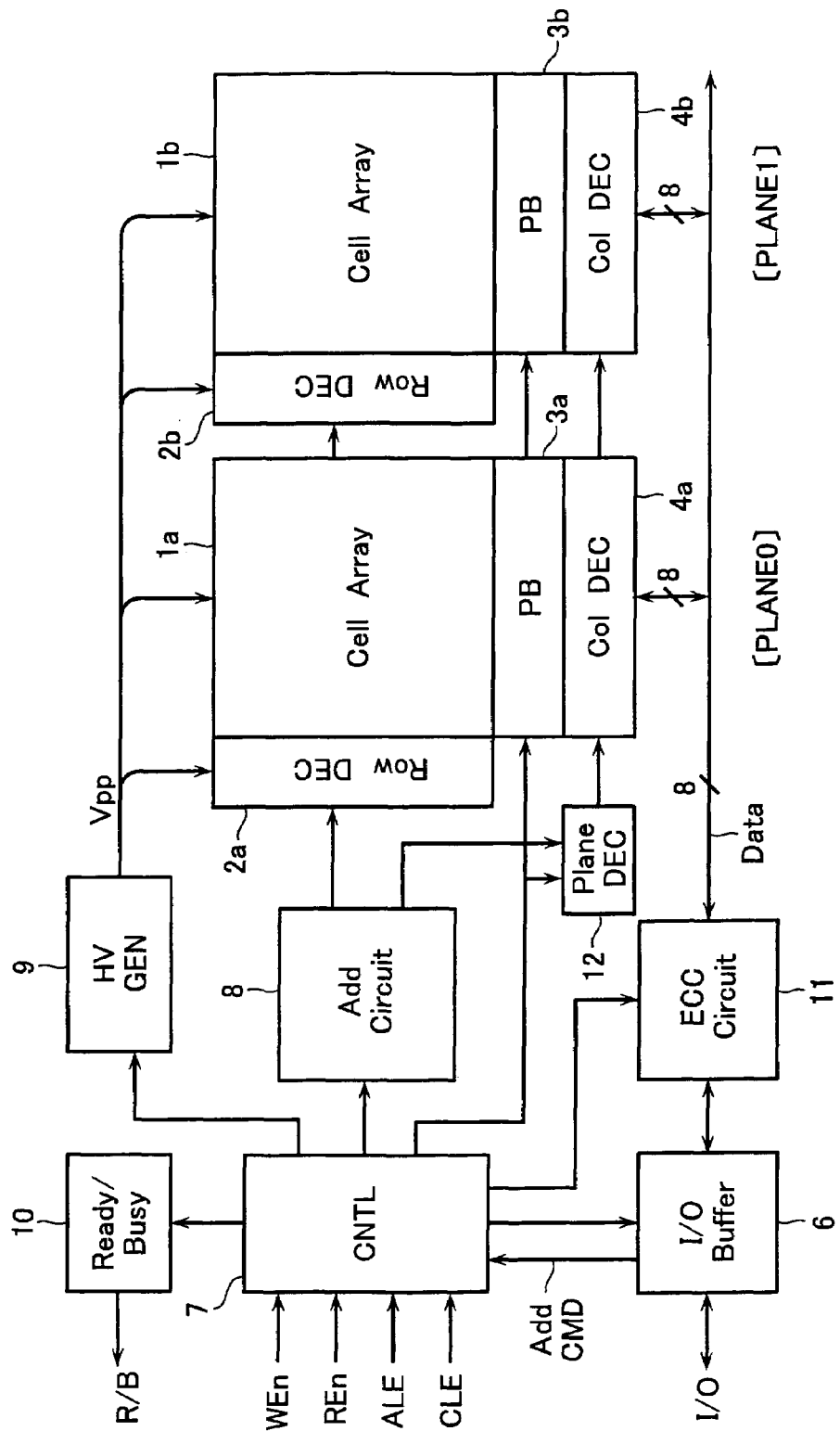
FIG. 14 shows a block configuration of a flash memory in accordance with another embodiment.

FIG. 14 shows a block configuration of a NAND-type flash memory in accordance with Embodiment 4. This Embodiment 4 is different from Embodiment 1 shown in FIG. 1 in a fact that an ECC circuit 11 is integrally formed on a chip of the memory device. In detail, the ECC circuit 11 is disposed between the I/O buffer 6 and data bus 5. In a page copy mode in which page data are copied from one plane PLANE0 to the other plane PLANE1, the data read out in the page buffer 3a are not output outside of the chip, but serially transferred and input to the ECC circuit 11.

Only when an error bit has been corrected in the ECC circuit 11, 1-Byte data including the error-corrected bit are over-written into the page buffer 3b, and then copy-write is performed as similar to Embodiment 1.

According to this Embodiment 4, it is not required, as well as Embodiment 1, to take a long time for loading data into a page buffer in correspondence with a copy destination plane. Therefore, it becomes possible to do a page copy operation between planes with a high performance.

While Embodiments 1-4 have been explained as having a scheme in which read out data are subjected to error-checking and correcting, this invention is not limited to the Embodiments 1-4. That is, this invention may be applied with an advantageous effect to a flash memory system in which an ECC circuit is not disposed not only in the memory chip, but also outside of the memory chip.

Embodiment 5

As an embodiment, an electric card using the non-volatile semiconductor memory devices according to the above-described embodiments 1-4 of the present invention and an electric device using the card will be described bellow.

Figure 15:
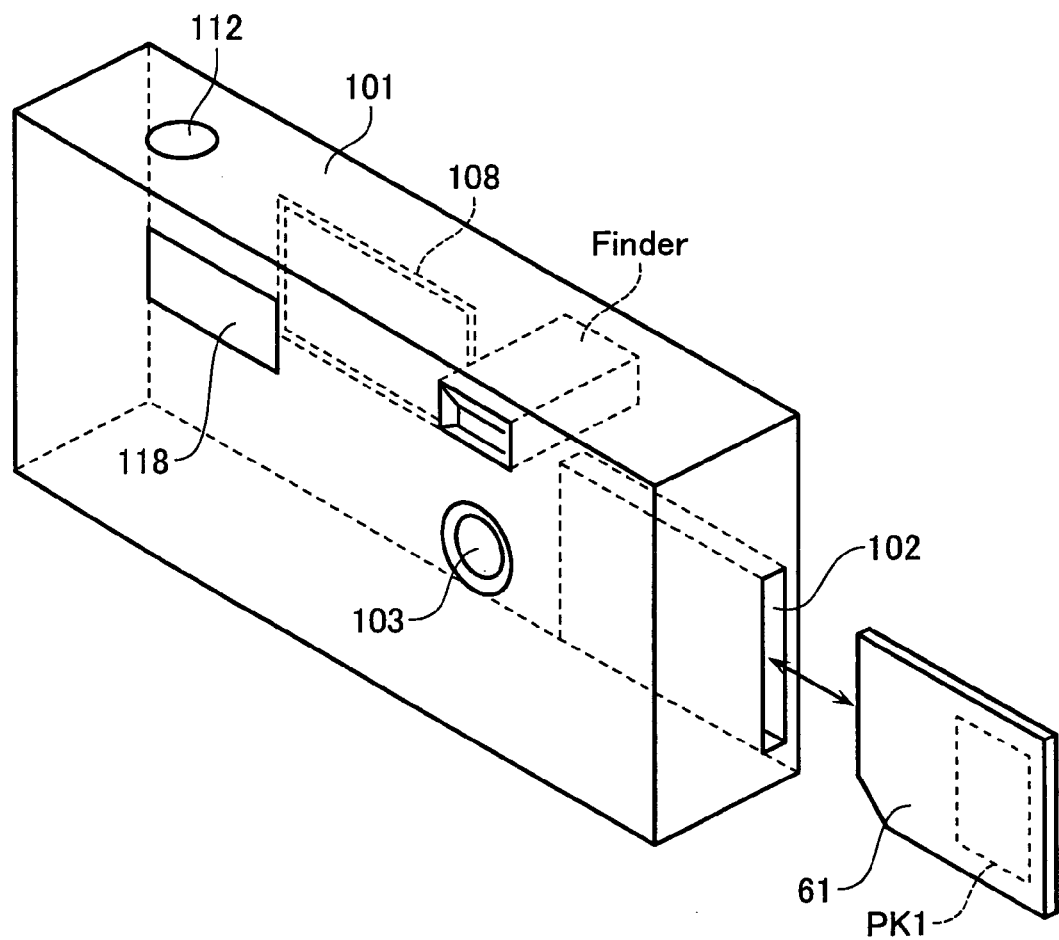
FIG. 15 shows another embodiment applied to a digital still camera.

FIG. 15 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 16:
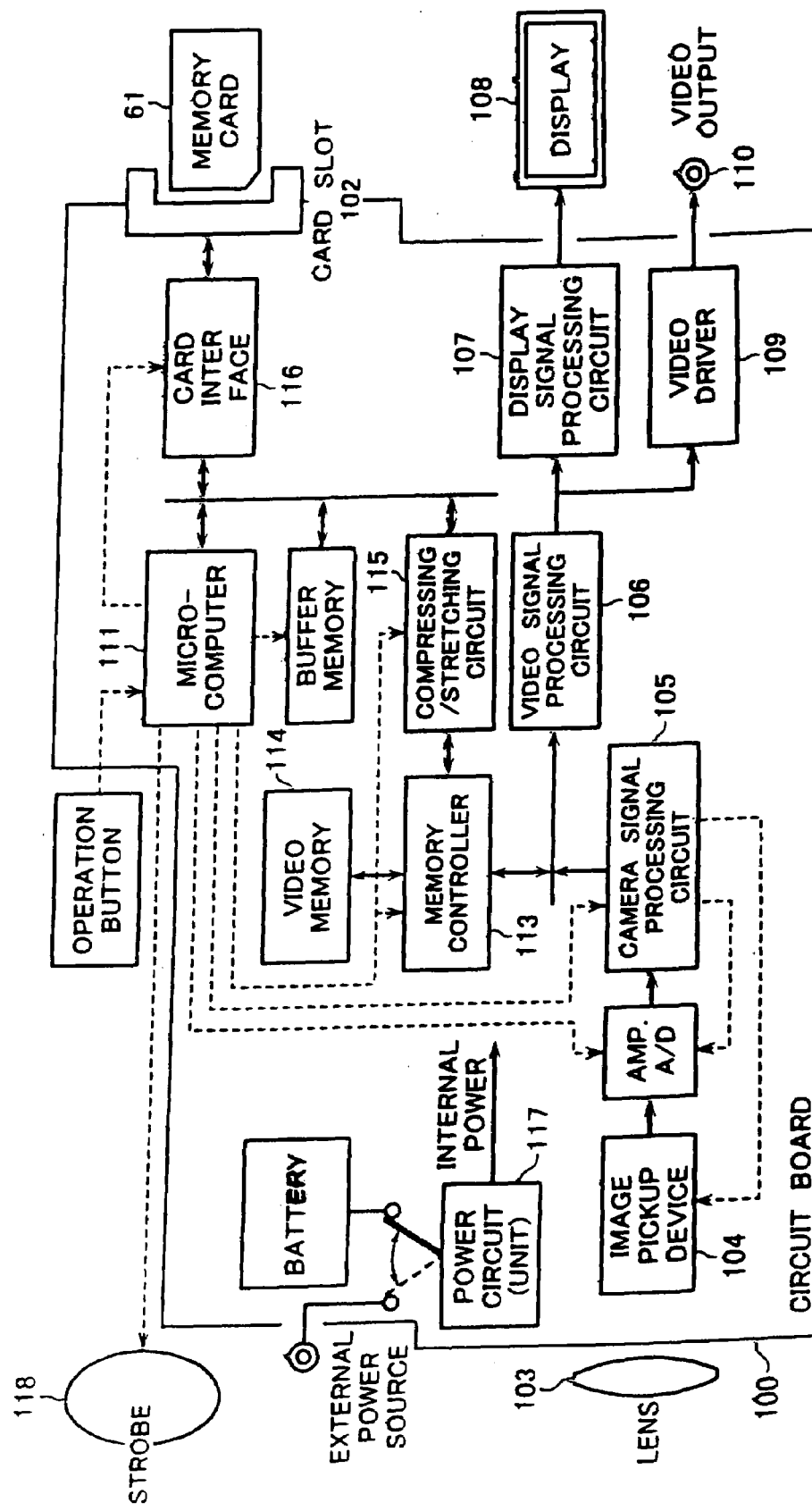
FIG. 16 shows the internal configuration of the digital still camera.
Figure 17A:
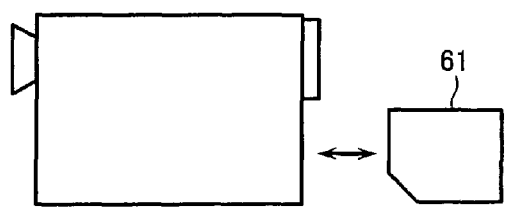
FIGS. 17A to 17J show other electric devices to which the embodiment is applied.
Figure 17F:
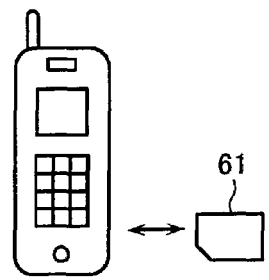
Figure 17B:
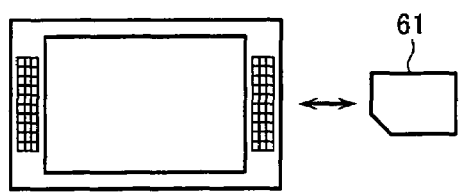
Figure 17G:
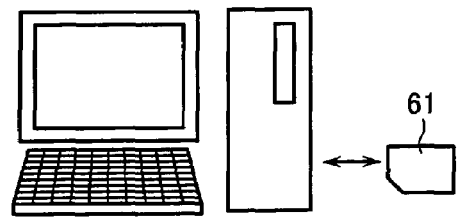
Figure 17C:
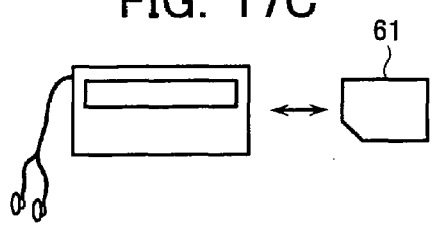
Figure 17H:
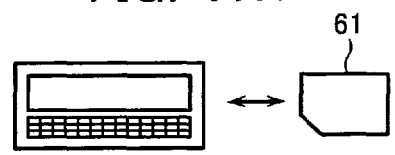
Figure 17D:
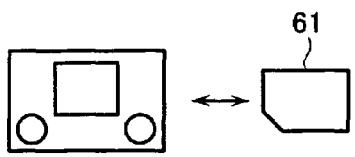
Figure 17I:
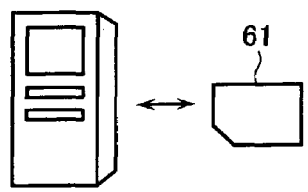
Figure 17E:
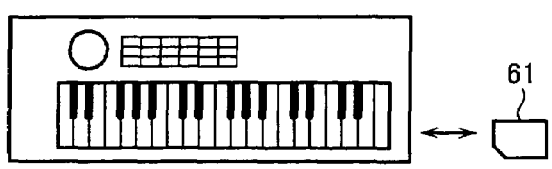
Figure 17J:
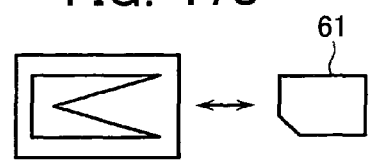

FIG. 16 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control, (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 17A to 17J, as well as in portable electric devices. That is, the electric card can also be used in a video camera shown in FIG. 17A, a television set shown in FIG. 17B, an audio apparatus shown in FIG. 17C, a game apparatus shown in FIG. 17D, an electric musical instrument shown in FIG. 17E, a cell phone shown in FIG. 17F, a personal computer shown in FIG. 17G, a personal digital assistant (PDA) shown in FIG. 17H, a voice recorder shown in FIG. 17I, and a PC card shown in FIG. 17J.

This invention is not limited to the above-described embodiments. For example, this invention may be applied to various flash memories such as of NOR-type, DINOR-type, AND-type, and the like. Further, it will be understood by those skilled in the art that various changes in form and detail may be made without departing from the spirit, scope, and teaching of the invention.

What is claimed is:

1. A non-volatile semiconductor memory device comprising:
   a first cell having electrically rewritable and non-volatile memory cells arranged therein, said memory cells of said first cell array being connected to first bit lines;
   a second cell array having electrically rewritable and non-volatile memory cells arranged therein, said memory cells of said second cell array being connected to second bit lines;
   a first page buffer disposed in correspondence with said first cell array for reading and writing data by a page of the first cell array via said first bit lines; and
   a second page buffer disposed in correspondence with said second cell array for reading and writing data by a page of the second cell array via said second bit lines;
   wherein said non-volatile semiconductor memory device has a page copy mode performed as follows: read out data of a copy source page within said first cell array to said first page buffer; transfer the read out data to said second page buffer via a data bus; and then write the read out data into a copy destination page of said second cell array.

2. The non-volatile semiconductor memory device according to claim 1, wherein said page copy mode is performed as follows: the read out data stored in said first page buffer is transferred on said data bus to be input to an ECC circuit and simultaneously loaded in said second page buffer; and loaded data in said second page buffer are rewritten for a part thereof including an error bit in case it has been detected in said ECC circuit, and written into said second cell array.

3. The non-volatile semiconductor memory device according to claim 2, wherein
   in said page copy mode, the read out data stored in said first page buffer is serially transferred by a byte to be input to the ECC circuit and simultaneously loaded in said second page buffer.

4. The non-volatile semiconductor memory device according to claim 2, wherein
   said page copy mode is performed as follows: the entire bits of the read out data stored in said first page buffer are transferred to said second page buffer at a time; and then the read out data is serially transferred by a byte on said data bus to be input to the ECC circuit.

5. The non-volatile semiconductor memory device according to claim 2, wherein
   said ECC circuit is formed on a chip of said memory device.

6. The non-volatile semiconductor memory device according to claim 2, wherein
   said ECC circuit is disposed outside of a chip of said memory device.

7. The non-volatile semiconductor memory device according to claim 1, wherein
   each of said first and second cell arrays is formed of NAND cell units arranged in a matrix manner.

8. The non-volatile semiconductor memory device according to claim 1, wherein
   in said page copy mode, the read out data stored in said first page buffer is further written into the second cell array.

9. A non-volatile semiconductor memory device comprising:
   a first cell array having electrically rewritable and non-volatile memory cells arranged therein, said memory cells of said first cell array being connected to first bit lines;
   a second cell array having electrically rewritable and non-volatile memory cells arranged therein, said memory cells of said second cell array being connected to second bit lines;
   a first page buffer disposed in correspondence with said first cell array for reading and writing data by a page of the first cell array via said first bit lines;
   a second page buffer disposed in correspondence with said second cell array for reading and writing by a page of the second cell array via said second bit lines;
   row decoders disposed in correspondence with the first and second cell arrays respectively for selecting a page of the first and second cell arrays; and
   column decoders disposed in correspondence with the first and second page buffers respectively for column-selecting for serially data transferring between the first and second page buffers and a data bus; and
   a plane select decoder configured to select one of said column decoders in a normal data read mode, and select all of said column decoders in a page copy mode; and
   a controller configured to control data read and write of said first and second cell arrays, and execute a page copy mode performed as follows: read out data of a copy source page within said first cell array to said first page buffer; transfer the read out data to said second page buffer via said data bus; and then write the read out data into a copy destination page of said second cell array.

10. The non-volatile semiconductor memory device according to claim 9, wherein
    said page copy mode is performed as follows: the read out data stored in said first page buffer is transferred on said data bus to be input to an ECC circuit and simultaneously loaded in said second page buffer; and loaded data in said second page buffer are rewritten for a part thereof including an error bit in case it has been detected in said ECC circuit, and written into said second cell array.

11. The non-volatile semiconductor memory device according to claim 10, wherein
    in said page copy mode, the read out data stored in said first page buffer is serially transferred by a byte to be input to the ECC circuit and simultaneously loaded in said second page buffer.

12. The non-volatile semiconductor memory device according to claim 10, wherein
    said page copy mode is performed as follows: the entire bits of the read out data stored in said first page buffer are transferred to said second page buffer at a time; and then the read out data is serially transferred by a byte on said data bus to be input to the ECC circuit.

13. The non-volatile semiconductor memory device according to claim 10, wherein
    said ECC circuit is formed on a chip of said memory device.

14. The non-volatile semiconductor memory device according to claim 10, wherein
    said ECC circuit is disposed outside of a chip of said memory device.

15. The non-volatile semiconductor memory device according to claim 9, wherein
    each of said first and second cell arrays is formed of NAND cell units arranged in a matrix manner.

16. The non-volatile semiconductor memory device according to claim 9, wherein
    in said page copy mode, the read out data stored in said first page buffer is further written into said second cell array.

17. An electric card equipped with a non-volatile semiconductor memory device described in claim 9.

18. The non-volatile semiconductor memory device according to claim 1, wherein said data bus is shared by said first and second cell arrays for data transferring between said first and second page buffers and external terminals.

* * * * *